US010168186B2

(12) United States Patent
Duret et al.

(10) Patent No.: US 10,168,186 B2
(45) Date of Patent: Jan. 1, 2019

(54) SENSOR FOR DETECTING A PERIOD MAGNETIC FIELD

(71) Applicant: NTN-SNR ROULEMENTS, Annecy (FR)

(72) Inventors: Christophe Duret, Bluffy (FR); Cyril Peterschmitt, La Balme de Sillingy (FR)

(73) Assignee: NTN-SNR ROULEMENTS, Annecy (FR)

( * ) Notice: Subject to any disclaimer, the term of this patent is extended or adjusted under 35 U.S.C. 154(b) by 0 days.

(21) Appl. No.: 15/474,780

(22) Filed: Mar. 30, 2017

(65) Prior Publication Data

US 2017/0284831 A1 Oct. 5, 2017

(30) Foreign Application Priority Data

Mar. 31, 2016 (FR) ...................................... 16 52810

(51) Int. Cl.
*G01B 7/14* (2006.01)
*G01D 5/165* (2006.01)
(Continued)

(52) U.S. Cl.
CPC .............. *G01D 5/165* (2013.01); *G01D 5/16* (2013.01); *G01R 33/093* (2013.01); *G01R 33/098* (2013.01)

(58) Field of Classification Search
CPC  G01R 33/093; G01R 33/098; G01R 33/0029; G01R 33/02; G01R 33/072; G01R 33/07; G01R 33/09; G01R 33/0023; G01B 7/30; G01B 7/14; G01B 7/03; G01D 5/145; G01D 5/147; G01D 5/165; G01D 11/345;
(Continued)

(56) References Cited

U.S. PATENT DOCUMENTS

| 2007/0047152 A1 | 3/2007 | Furukawa et al. | |
| 2007/0159164 A1* | 7/2007 | Hehn ..................... | B82Y 25/00 324/207.21 |

(Continued)

FOREIGN PATENT DOCUMENTS

| EP | 2602593 A1 | 6/2013 |
| EP | 2602594 A1 | 6/2013 |

(Continued)

*Primary Examiner* — Thang Le
(74) *Attorney, Agent, or Firm* — Marshall, Gerstein & Borun LLP

(57) ABSTRACT

A sensor including a measuring assembly integrating at least one magnetoresistive element having a stack of two conductive magnetic layers, respectively reference and sensitive, the reference layer having magnetic anisotropy in the direction X and the sensitive layer having a direction Y, a polarization permanent magnet having a surface extending in a plane of directions X and Y and having a symmetry plane of directions X and Z, the measuring assembly being disposed with respect to the symmetry plane of the polarization magnet so that the layers of the magnetoresistive element are disposed in a plane parallel to the surface while being offset from said plane in the direction Y by a distance ($\Delta y$) that is arranged so that the magnetic field of the polarization magnet orients the magnetisation of the sensitive layer in the direction Y.

12 Claims, 1 Drawing Sheet

(51) Int. Cl.
*G01R 33/09* (2006.01)
*G01D 5/16* (2006.01)
(58) Field of Classification Search
CPC .......... G01P 3/443; G01P 3/448; G01P 3/447; G01P 3/665; H04M 1/0245; H04M 1/0216
See application file for complete search history.

(56) References Cited

U.S. PATENT DOCUMENTS

| | | | | |
|---|---|---|---|---|
| 2009/0121819 A1* | 5/2009 | Haratani | ................ | G01R 33/09 336/221 |
| 2009/0251830 A1* | 10/2009 | Kurata | .................. | B82Y 25/00 360/324 |
| 2009/0309581 A1* | 12/2009 | Fermon | ................. | G01R 33/09 324/207.21 |
| 2013/0066587 A1* | 3/2013 | Kalathil | .................. | G01D 5/06 702/150 |
| 2014/0015384 A1* | 1/2014 | Someya | ............... | G01D 5/2454 310/68 B |
| 2015/0115939 A1* | 4/2015 | Abe | ........................ | G01D 5/16 324/207.21 |

FOREIGN PATENT DOCUMENTS

| | | |
|---|---|---|
| FR | 2792403 A1 | 10/2000 |
| WO | WO-2004/083881 A1 | 9/2004 |
| WO | WO-2006/064169 A2 | 6/2006 |

\* cited by examiner

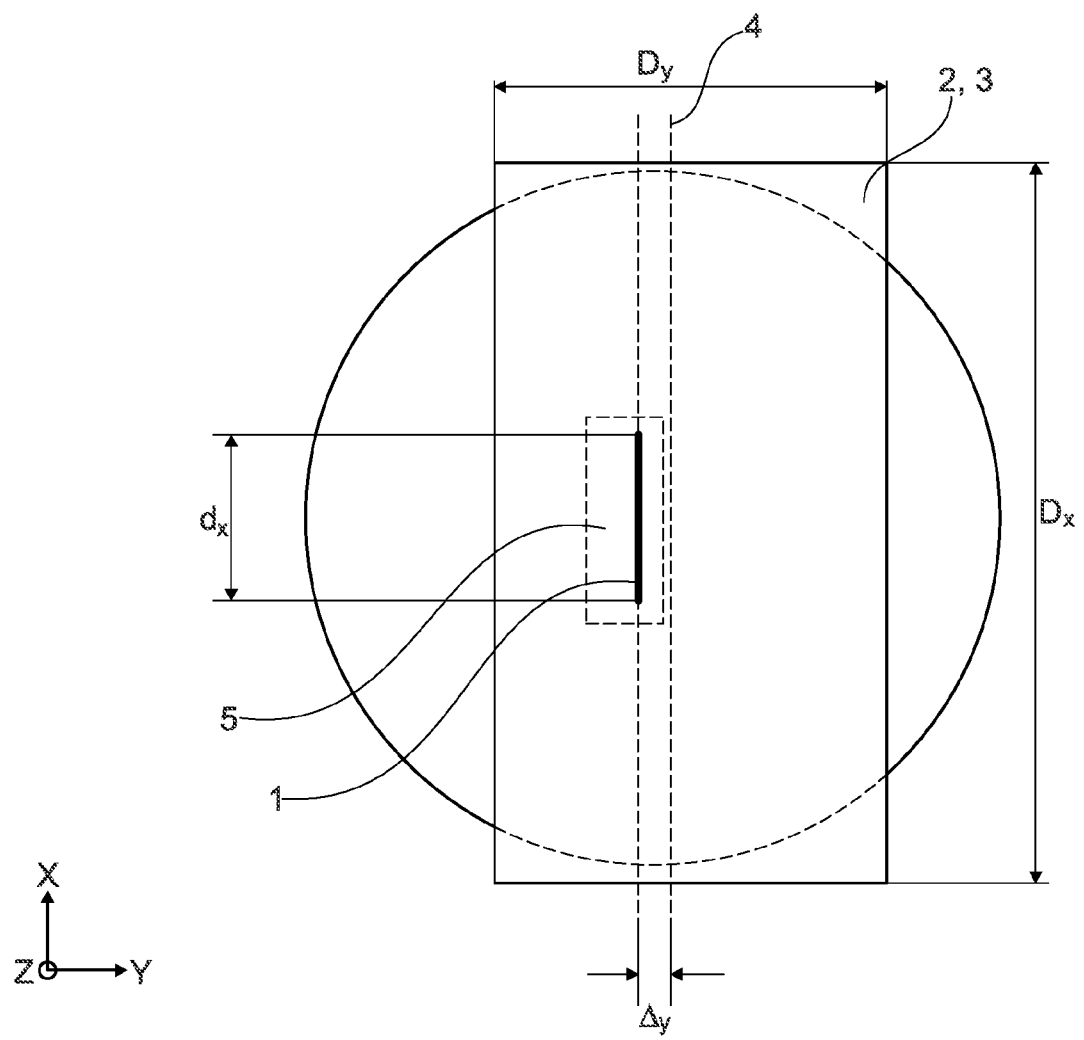

SENSOR FOR DETECTING A PERIOD MAGNETIC FIELD

CROSS-REFERENCE TO RELATED APPLICATION

The present application claims priority to French Application No. FR-1652810. The priority application, FR-1652810, is hereby incorporated by reference.

BACKGROUND

Field of the Disclosure

The invention relates to a sensor for detecting a periodic magnetic field, comprising a measuring assembly integrating at least one magnetoresistive element the electrical resistance of which varies as a function of the amplitude of the component of said magnetic field in one direction, as well as a system for determining at least one movement parameter of a member able to move with respect to a fixed structure.

Description of the Related Art

In numerous applications, it is wished to know, in real time and with optimum quality, at least one parameter of linear and/or angular movement of a movable member, such as its position, its velocity, its acceleration or its direction of movement.

To do this, the document WO 2006/064169 proposes the use of an encoder intended to be secured to the movable member and which is arranged to deliver a pseudosinusoidal magnetic field at a reading distance from a sensor comprising a plurality of sensitive elements.

To determine a movement parameter of the movable member as a function of the change in the magnetic field, the sensor comprises an electronic circuit arranged so as to use the variations in electrical resistance of the sensitive element in order to deliver a signal representing the magnetic field to be detected.

In particular, the document WO 2006/064169 provides for the sensitive elements to be integrated in an assembly for measuring in a current loop in order to combine signals representing the resistance of each of the sensitive elements so as to deliver two signals in quadrature and of the same amplitude, which can be used for calculating the parameter. The connection of sensitive elements in a Wheatstone bridge is also known.

Advantageously, each sensitive element may comprise at least one pattern based on a magnetoresistive material, in particular with a tunnel effect (TMR, standing for tunnel magnetoresistance), the resistance of which varies as a function of the magnetic field, as for example described in the document WO 2004/083881.

In particular, each pattern then comprises two conductive layers between which an insulating layer is disposed so as to form a succession of tunnel junctions in a measuring assembly. The conductive layers form respectively a magnetic layer sensitive to the field to be measured and a reference magnetic layer, the electrical resistance between the conductive layers being dependent on the relative orientation of the magnetisation of each of said layers.

To do this, the sensitive and reference layers each comprise a magnetic anisotropy direction that are perpendicular while being arranged so as to cause, by relative rotation, a variation in electrical resistance that is linear over a magnetic field range to be detected.

However, adjusting the anisotropy of the sensitive layer may be complex, in particular to attempt to make it insensitive to the different temperature and magnetic field conditions to be detected. Achieving this anisotropy moreover makes it more tricky and expensive to manufacture the sensitive layers. Thus, under certain temperature and/or magnetic field conditions to be detected, this implementation does not give complete satisfaction in that the correct perpendicularity of the magnetic anisotropies is not sufficiently ensured to guarantee good linearity of detection.

The document U.S. Pat. No. 2007/047152 describes the use of a polarisation magnet to measure the magnetic field of a magnet to be detected by means of a magnetoresistive element, in which the magnetic field of the polarisation magnet is arranged so as to suppress the magnetisation of the free layer of said magnetoresistive element and to reduce the rotation angle of the magnetised vector.

SUMMARY OF THE DISCLOSURE

The invention aims to improve the prior art by proposing a sensor for detecting a periodic magnetic field that has improved reliability, in particular according to the operating temperature.

To this end, according to a first aspect, the invention proposes a sensor for detecting a periodic magnetic field comprising a measuring assembly integrating at least one magnetoresistive element the electrical resistance of which varies as a function of the amplitude of the component of said magnetic field in a direction X, said magnetoresistive element comprising a stack of two conductive magnetic layers, respectively reference and sensitive, between which a separation layer is disposed so that the electrical resistance of said stack is dependent on the relative orientation of the magnetisation of the reference and sensitive layers, said sensor comprising an electronic circuit arranged so as to use the variations in said electrical resistance in order to deliver a signal representing the magnetic field to be detected, the reference layer having magnetic anisotropy in the direction X and the sensitive layer having a direction Y perpendicular to the direction X, said sensor further comprising a permanent polarisation magnet having a surface extending in a plane of directions X and Y and having a symmetry plane of directions X and Z, the direction Z being perpendicular to the directions X and Y and being the direction along which the magnetic field of said magnet mainly extends, the measuring assembly being disposed with respect to the symmetry plane of the polarisation magnet so that the layers of the magnetoresistive element are disposed in a plane parallel to the surface while being offset from said plane in the direction Y by a distance that is arranged so that the magnetic field of the polarisation magnet orients the magnetisation of the sensitive layer in the direction Y while allowing variations in the orientation of said magnetisation according to the component of the direction X of the magnetic field to be detected, said variations in magnetisation causing a linear variation in the electrical resistance of the magnetoresistive element over a magnetic field range to be detected.

According to a second aspect, the invention proposes a system for determining at least one movement parameter of a member able to move with respect to a fixed structure, said system comprising:

an encoder intended to be secured to the movable member so as to move conjointly with it, said encoder being arranged so as to deliver a periodic magnetic field that represents the movement of the encoder;

a detection sensor according to the first aspect that is intended to be secured to the fixed structure with the measuring assembly at a detection distance from the magnetic field;

a computing device for determining the movement parameter of the movable member according to variations in electrical resistance of the measuring assembly.

Other particularities and advantages of the invention will emerge in the following description, given with reference to the accompanying figure, which shows schematically the relative arrangement of the measuring assembly and of a polarisation magnet in a detection sensor according to one embodiment of the invention.

In relation to this figure, a system for determining at least one movement parameter of a member able to move with respect to a fixed structure is described. In particular, the parameter may be chosen from a linear and/or angular movement parameter of the movable member, such as its position, its speed, its acceleration or its direction of movement.

In a particular application, the system may be used in relation to a rolling bearing in order to measure a rotation parameter of the rotating member of said bearing with respect to its fixed member.

The determination system comprises an encoder intended to be secured to the movable member so as to move conjointly with it, said encoder being arranged so as to deliver a periodic magnetic field that represents the movement of the encoder and therefore of the movable member.

The determination system also comprises a detection sensor that is intended to be secured to the fixed structure, said sensor being intended to detect the periodic magnetic field delivered by the encoder. To do this, the sensor comprises a measuring assembly 1 integrating at least one magnetoresistive element the electrical resistance of which varies according to the amplitude of the component of the magnetic field in a direction X.

The measuring assembly 1 is disposed at a detection distance from the magnetic field and the determination system comprises a computing device for determining the movement parameter of the movable member as a function of variations in electrical resistance of the measuring assembly 1.

In relation to the figure, the measuring assembly 1 extends in a linear geometry in the direction X, in particular integrating a plurality of magnetoresistive elements. According to one embodiment, the magnetoresistive elements are integrated in a measuring assembly 1 in a Wheatstone bridge. According to another embodiment, the magnetoresistive elements are integrated in a measuring assembly 1 in a current loop. Moreover, a magnetoresistive element may comprise a plurality of magnetoresistive patterns that are aligned, as described in the documents FR 2 792 403, EP 2 602 593 or EP 2 602 594.

The magnetoresistive element comprises a stack of two conductive magnetic layers, respectively reference and sensitive, between which a separation layer is disposed so that the electrical resistance of said stack is dependent on the relative orientation of the magnetisation of the reference and sensitive layers.

In particular, the reference layer has magnetic anisotropy in the direction X and the sensitive layer has a direction Y perpendicular to the direction X. Thus, by disposing the magnetoresistive element at a detection distance from the component along X of the magnetic field to be detected, an induced rotation of the magnetisation of the sensitive layer with respect to the reference layer varies the resistance of said element according to said component. In particular, the sensitive layer may have a preferential direction of magnetisation in the direction Y.

According to an advantageous embodiment, the magnetoresistive element is of the tunnel effect type, having a separation layer that is insulating. In a variant, the separation layer may be conductive in order to form a magnetoresistive element of the GMR type.

The sensor comprises an electronic circuit that is arranged so as to use the variations in electrical resistance of the magnetoresistive element in order to deliver a signal representing the magnetic field to be detected. In particular, the variations in electrical resistance may be proportional to those of the component along X of the magnetic field to be detected.

The sensor further comprises a so-called polarisation permanent magnet 2 that has a surface 3 extending in a plane of directions X and Y and having a symmetry plane 4 of directions X and Z, the direction Z being perpendicular to the directions X and Y and being the direction along which the magnetic field of said magnet mainly extends.

In relation to the figure, the measuring assembly 1 is disposed with respect to the symmetry plane 4 of the polarisation magnet 2 so that the layers of the magnetoresistive elements are disposed in a plane parallel to the surface 3. Thus the magnetoresistive element is insensitive to the main component of the magnetic field of the polarisation magnet 2 since the sensitive and reference layers extend in a plane of directions X and Y.

Furthermore, the layers of the magnetoresistive element are offset from the symmetry plane 4 of the polarisation magnet 2 in the direction Y by a distance $\Delta y$ that is arranged so that the magnetic field of the polarisation magnet 2 orients the magnetisation of the sensitive layer in the direction Y while allowing variations in the orientation of said magnetisation according to the component in the direction X of the magnetic field to be detected.

Thus, whatever the direction of the intrinsic magnetisation of the sensitive layer, in particular according to the operating temperature of the sensor, the small component in the direction Y of the magnetic field of the polarisation magnet 2 causes the perpendicularity of said magnetisation with respect to that of the reference layer. In particular, the magnetisation of the sensitive layer may be free and the polarisation magnet 2 saturates the sensitive layer in order to give it its magnetisation in the direction Y, or have been pre-orientated, for example having an anisotropy axis perpendicular to the reference layer, the polarisation magnet 2 protecting this relative orientation, in particular with respect to the temperature and/or the magnetic field to be detected.

In particular, the magnetic field of the polarisation magnet 2 makes it possible to guarantee the perpendicularity of the magnetisation of the sensitive and reference layers so that the variations in the component along X of the field to be detected cause a linear variation in the electrical resistance of the magnetoresistive element over a magnetic field range to be detected.

According to one embodiment, the polarisation magnet 2 is produced from ferrite in order to have a sufficiently strong magnetisation to cause the orientation of the sensitive layer in a stable fashion vis-à-vis the temperature, while allowing its rotation according to the component along X of the field to be detected.

Moreover, the measuring assembly 1 may be offset from the symmetry plane 4 by a distance $\Delta y$ that is between 5 and 15% of the dimension Dy of the surface 3 of the polarisation magnet 2 in the direction Y. However, the offset distance $\Delta y$ may vary according in particular to the nominal reading distance between the measuring assembly 1 and the encoder, the operating temperature and the magnetic field to be detected.

In particular, the greater the offset Δy, the more the orientation in the direction of Y of the magnetisation of the sensitive layer is maintained, but to the detriment of the sensitivity of the sensor. On the other hand, the smaller the offset Δy, the more the sensitivity of the sensor is obtained to the detriment of a reduction in the linearity range of the detection, because of the incomplete saturation of the sensitive layer.

DESCRIPTION OF THE DRAWING

The drawing figure is a top view of an electronic card having a measuring assembly of the present disclosure thereon, in combination with a magnet to which the electronic card is fixed.

DETAILED DESCRIPTION OF THE PREFERRED EMBODIMENT

In relation to the figure, the measuring assembly 1 is disposed opposite a central part of the surface 3 of the polarisation magnet 2 in order to prevent edge effects of the magnet 2 on the measuring assembly 1. Moreover, the size of the surface 3 of the magnet 2 is substantially greater than that of the measuring assembly 1. In particular, in the direction X, the dimension dx of the measuring assembly 1 is very much less than the dimension Dx of the magnet 2.

According to an advantageous embodiment, the measuring assembly 1 is formed on a face of an electronic card 5, the other face of said card being fixed to the surface 3 of the polarisation magnet 2. The electronic card 5 includes the electronic circuit comprising in particular a device for processing signals representing the resistance of the magnetoresistive elements that is arranged to deliver at least one signal representing the component X of the magnetic field to be detected.

In particular, the processing device may comprise means for measuring signals that each represent the resistance of a magnetoresistive element, as well as means for combining said signals in order to deliver at least one signal representing the component X of the magnetic field.

In relation to a measuring assembly 1 in a Wheatstone bridge, the processing device may comprise a comparator for the outputs of a bridge including a magnetoresistive element in at least one of its arms. In relation to a measuring assembly 1 in a current loop the processing device may comprise at least one stage of comparators that are connected to the terminals of the magnetoresistive elements in order to combine together the resistance signals of each of said elements.

In particular, the document WO 2006/064169 describes a processing device arranged to deliver two signals respectively SIN and COS in quadrature and with the same amplitude, that each represent the magnetic field to be detected, said signals being able to be used by a computing device of the system in order to determine the rotation parameter of the rotating member.

According to a particular embodiment, the encoder comprises at least one multipole magnetic strip that is able to emit a magnetic field, the component of which in the direction X varies pseudosinusoidally according to the movement of said strip relative to the measuring assembly 1.

In particular, the encoder comprises an alternating succession of north and south magnetic poles, for example formed on an annular magnet that can be produced from a matrix of plastics or elastomer material, in which magnetic particles are dispersed, in particular particles of ferrite or rare earths such as NdFeB.

According to another embodiment, the encoder has a ferromagnetic structure that is arranged so as to modify the magnetic field emitted by the polarisation magnet 2 so as to deliver a component of said field in the direction X that varies pseudosinusoidally according to the movement of said structure relative to the measuring assembly 1.

In particular, the encoder comprises a toothed metal structure that extends in particular annularly, the passage of said teeth in front of the polarisation magnet 2 causing an alteration to the magnetic field that it delivers essentially in the direction Z.

The invention claimed is:

1. A detection sensor for detecting a periodic magnetic field comprising a measuring assembly integrating at least one magnetoresistive element, electrical resistance of the magnetoresistive element varies as a function of the amplitude of the component of said periodic magnetic field in a direction X, said magnetoresistive element comprising a stack of two conductive magnetic layers indicated as reference and sensitive layers, respectively, a separation layer is disposed between the reference and sensitive layers, so that the electrical resistance of said stack is dependent on the relative orientation of the magnetization of the reference and sensitive layers, said detection sensor further comprising an electronic circuit configured to use the variations in said electrical resistance in order to deliver a signal representing the magnetic field to be detected, the reference layer having magnetic anisotropy in the direction X and the sensitive layer having magnetic anisotropy in a direction Y perpendicular to the direction X, said detection sensor including a permanent polarization magnet having a surface extending in a plane of directions X and Y and having a symmetry plane of directions X and Z, the direction Z being perpendicular to the directions X and Y and being the direction along which the magnetic field of said permanent polarization magnet mainly extends, the measuring assembly being disposed with respect to the symmetry plane of the permanent polarization magnet so that the reference layer, the sensitive layer, and the separation layer of the magnetoresistive element are disposed in a plane parallel to the surface while being offset from said plane in the direction Y by a distance (Δy) that is arranged so that the magnetic field of the permanent polarization magnet orients the magnetization of the sensitive layer in the direction Y while allowing variations in the orientation of said magnetization according to the component of the direction X of the magnetic field to be detected, said variations in magnetization causing a linear variation in the electrical resistance of the magnetoresistive element over a magnetic field range to be detected, and the measuring assembly being offset from the symmetry plane by a distance (Δy) that lies between 5 and 15% of the dimension (Dy) of the surface of the polarization magnet in the direction Y.

2. The detection sensor according to claim 1, the sensitive layer having a preferential direction of magnetization in the direction Y.

3. The detection sensor according to claim 1, the measuring assembly including a plurality of magnetoresistive elements that are disposed in a linear geometry extending in the direction X.

4. The detection sensor according to claim 3, the magnetoresistive elements being included in the measuring assembly in a Wheatstone bridge.

5. The detection sensor according to claim 3, the magnetoresistive elements being included in the measuring assembly in a current loop.

6. The detection sensor according to claim 1, the measuring assembly being disposed opposite a central part of the surface of the polarization magnet.

7. The detection sensor according to claim 1, the measuring assembly being formed on one face of an electronic card, the other face of said card being fixed to the surface of the polarization magnet.

8. The detection sensor according to claim 1, the polarization magnet being produced from ferrite.

9. The detection sensor according to claim 1, the magnetoresistive element being of the tunnel effect type.

10. A system for determining at least one movement parameter of a member able to move with respect to a fixed structure, said system comprising:
   an encoder securable to the movable member so as to move conjointly with it, said encoder being arranged so as to deliver a periodic magnetic field that represents the movement of the encoder;
   a detection sensor according to claim 1 that is securable to the fixed structure with the measuring assembly at a detection distance from the magnetic field; and
   a computing device for determining the movement parameter of the movable member according to variations in electrical resistance of the measuring assembly.

11. The determination system according to claim 10, the encoder comprising at least one multipole magnetic track that is able to emit a magnetic field, the component of which in the direction X varies pseudosinusoidally according to the movement of said track relative to the measuring assembly.

12. The determination system according to claim 10, the encoder having a ferromagnetic structure that is arranged so as to modify the magnetic field emitted by the polarization magnet so as to deliver a component of said field in the direction X that varies pseudosinusoidally according to the movement of said structure relative to the measuring assembly.

* * * * *